(12) United States Patent
Hall et al.

(10) Patent No.: US 6,638,145 B2
(45) Date of Patent: Oct. 28, 2003

(54) CONSTANT PH POLISH AND SCRUB

(75) Inventors: Stacy W. Hall, San Antonio, TX (US); Andrew J. Black, San Antonio, TX (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 152 days.

(21) Appl. No.: 09/943,960

(22) Filed: Aug. 31, 2001

(65) Prior Publication Data

US 2003/0109200 A1 Jun. 12, 2003

(51) Int. Cl.$^7$ ................................................ B24B 1/00
(52) U.S. Cl. ........................ 451/41; 451/36; 451/37; 451/57; 134/3
(58) Field of Search .............................. 451/41, 54, 57, 451/63, 36, 37; 134/3

(56) References Cited

U.S. PATENT DOCUMENTS

| | | |
|---|---|---|
| 5,597,443 A | 1/1997 | Hempel |
| 5,607,718 A | 3/1997 | Sasaki et al. |
| 5,643,406 A | 7/1997 | Shimomura et al. |
| 5,704,987 A | 1/1998 | Huynh et al. |
| 5,772,780 A | 6/1998 | Homma et al. |
| 5,816,891 A | 10/1998 | Woo |
| 5,851,899 A | 12/1998 | Weigand |
| 5,893,756 A | 4/1999 | Berman et al. |
| 5,895,550 A | 4/1999 | Andreas |
| 5,899,738 A | 5/1999 | Wu et al. |
| 5,922,136 A | 7/1999 | Huang |
| 5,922,620 A | 7/1999 | Shimomura et al. |
| 5,935,869 A | 8/1999 | Huynh et al. |
| 5,989,105 A * | 11/1999 | Kawakawaguchi et al. ... 451/44 |
| 6,012,966 A * | 1/2000 | Ban et al. ........................ 451/8 |
| 6,077,785 A | 6/2000 | Andreas |
| 6,080,046 A * | 6/2000 | Shendon et al. ............... 451/54 |
| 6,080,673 A | 6/2000 | Ko et al. |
| 6,096,650 A * | 8/2000 | Robinson et al. ........... 438/689 |
| 6,098,638 A | 8/2000 | Miyashita et al. |
| 6,099,662 A | 8/2000 | Wang et al. |
| 6,103,569 A | 8/2000 | Teo et al. |
| 6,130,163 A | 10/2000 | Yi et al. |
| 6,152,148 A | 11/2000 | George et al. |
| 6,159,076 A | 12/2000 | Sun et al. |
| 6,171,514 B1 | 1/2001 | Hara et al. |
| 6,180,497 B1 | 1/2001 | Sata et al. |
| 6,190,237 B1 | 2/2001 | Huynh et al. |
| 6,191,086 B1 | 2/2001 | Leon |
| 6,197,691 B1 | 3/2001 | Lee |
| 6,200,899 B1 | 3/2001 | Fournier |
| 6,204,169 B1 | 3/2001 | Bajaj et al. |
| 6,214,745 B1 | 4/2001 | Yang et al. |
| 6,220,934 B1 | 4/2001 | Sharples et al. |
| 6,227,946 B1 * | 5/2001 | Gonzalez-Martin et al. .. 451/54 |
| 6,228,771 B1 | 5/2001 | Allers |
| 6,232,241 B1 | 5/2001 | Yu et al. |
| 6,234,877 B1 * | 5/2001 | Koos et al. ..................... 451/41 |
| 6,252,709 B1 | 6/2001 | Sato |
| 6,361,407 B1 * | 3/2002 | Lu et al. ......................... 451/41 |
| 6,431,959 B1 * | 8/2002 | Mikhaylich et al. ........... 451/41 |

\* cited by examiner

*Primary Examiner*—M. Rachuba
(74) *Attorney, Agent, or Firm*—Peter Zawilski (57) ABSTRACT

A system and method are provided that maintains a high pH at the wafer surface through the entire polish process and then lowers the pH only when necessary in a controlled fashion after CMP and during the post-polish clean. A fluid having a high pH chemistry and, optionally, surfactants is used instead of deionized water to keep the wafer and polisher components wet and to clean the slurry residue from the polishing pad.

10 Claims, 9 Drawing Sheets

| CMP EQUIPMENT TYPE | PROCESS STEP | APPROXIMATE PROCESS PH |
|---|---|---|
| POLISH | Input Station | 6 |
| POLISH | Primary polish platen 1 | 11 |
| POLISH | Primary polish platen 1 rinse | 6 |
| POLISH | Primary polish platen 2 | 11 |
| POLISH | Pad and wafer rinse platen 2 | 6 |
| CLEAN | Input Station | 6 |
| CLEAN | Brush station 1 | 11 |
| CLEAN | Brush station 2 | 11 |
| CLEAN | Spin, rinse, dry station | 6 |

| CMP EQUIPMENT TYPE | PROCESS STEP | APPROXIMATE PROCESS PH |
|---|---|---|
| POLISH | Input Station | 11 |
| POLISH | Primary polish platen 1 | 11 |
| POLISH | Primary polish platen 1 rinse | 11 |
| POLISH | Primary polish platen 2 | 11 |
| POLISH | Pad and wafer rinse platen 2 | 11 |
| CLEAN | Input Station | 11 |
| CLEAN | Brush station 1 | 11 |
| CLEAN | Brush station 2 | 11 |
| CLEAN | Spin, rinse, dry station | 6 |

CONSTANT PH POLISH AND SCRUB

BACKGROUND OF THE INVENTION

1. Field of the Invention

The present inventions pertain to semiconductor fabrication processing. More particularly, the present inventions relate to a system for reducing defectivity during semiconductor processing by maintaining a constant pH during the planarization process.

2. Description of the Prior Art

Figure 1:
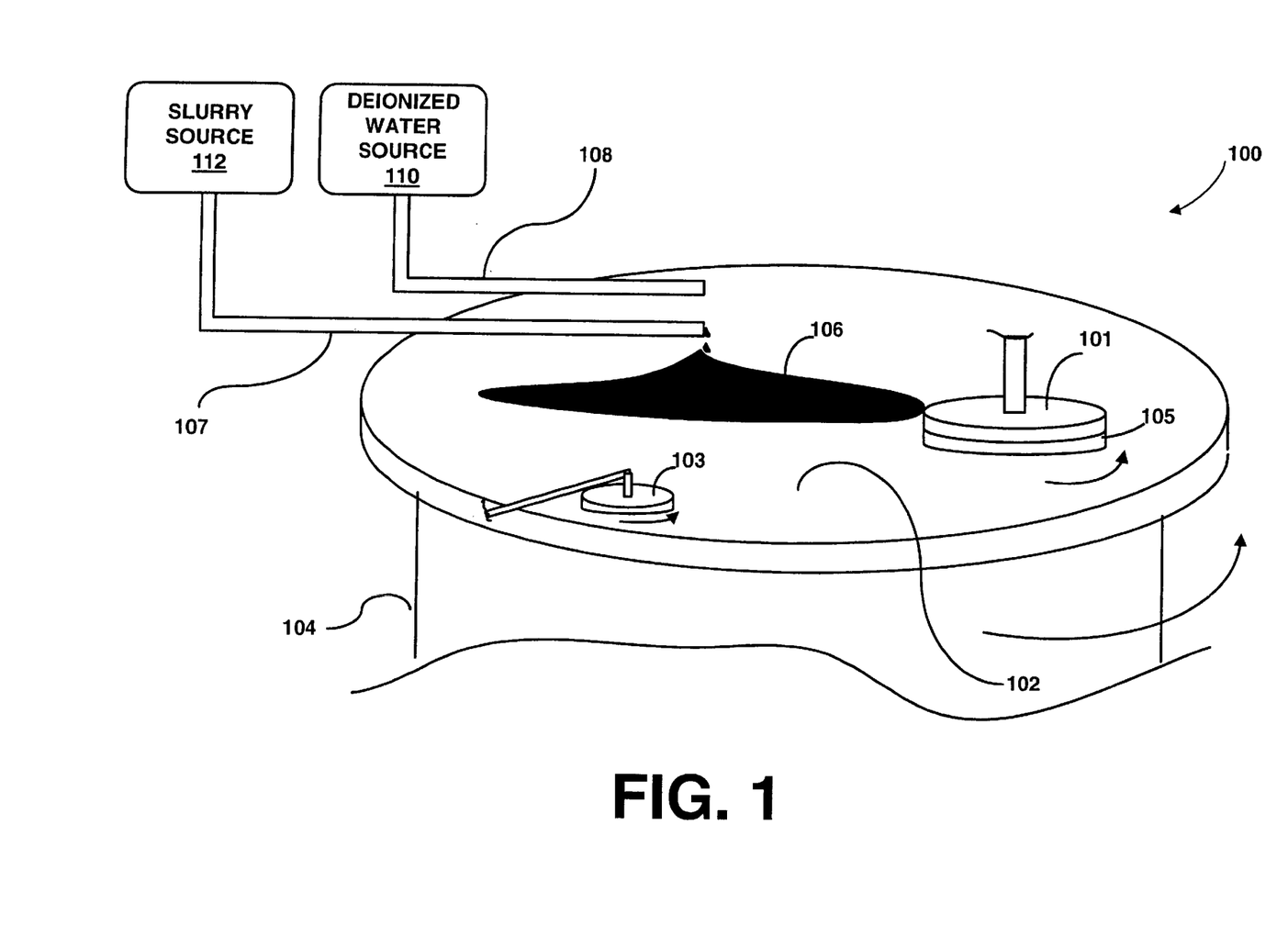
FIG. 1 is a block diagram of a prior art CMP machine.
Figure 2:
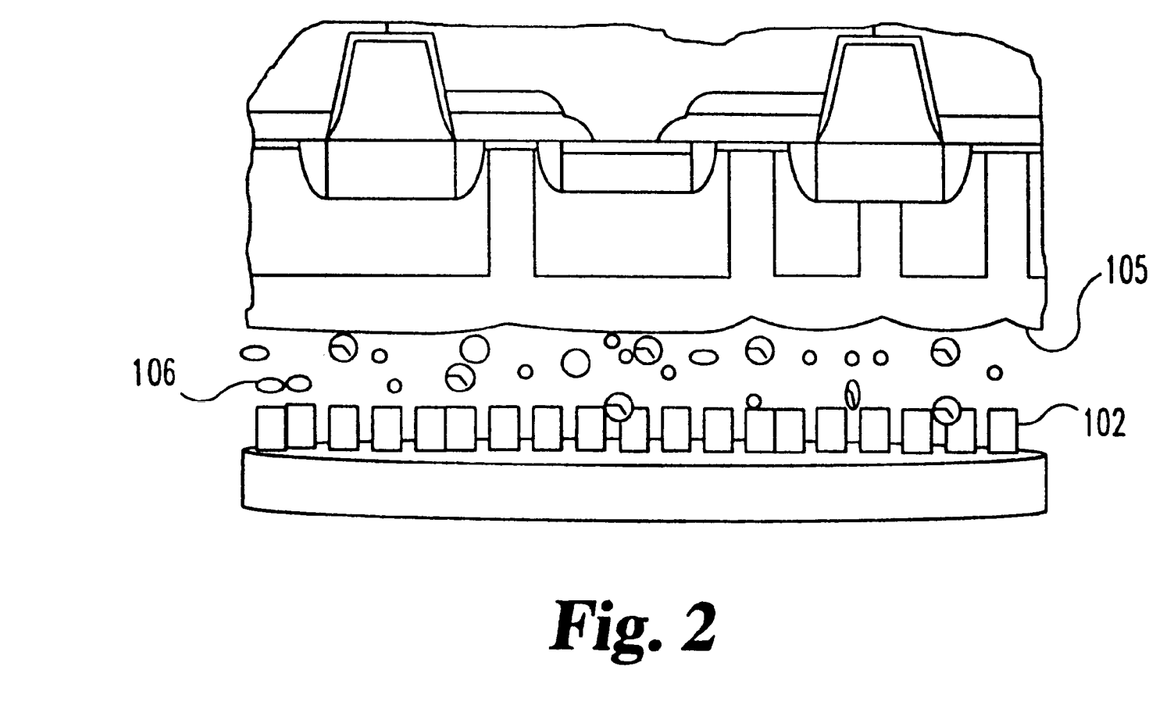
FIG. 2 is a side partial perspective view of a semiconductor wafer.

Referring now to FIGS. 1 and 2, there is shown a block diagram of a prior art CMP machine 100 and a side partial perspective view of a wafer 105 (FIG. 2). The CMP machine 100 is fed wafers to be polished by an arm 101 and places them onto a rotating polishing pad 102. The polishing pad 102 is made of a resilient material and is textured, often with a plurality of predetermined grooves, to aid the polishing process. A conditioning arm 103 conditions the polishing pad.

The polishing pad 102 rotates on a platen 104, a turntable located beneath the polishing pad 102, at a predetermined speed. A wafer is held in place on the polishing pad 102 and the arm 101 by a carrier ring and a carrier film not shown. The lower surface of the wafer 105 rests against the polishing pad 102. The upper surface of the wafer 105 is against the lower surface of the carrier film of the arm 101. As the polishing pad 102 rotates, the arm 101 rotates the wafer 105 at a predetermined rate. The arm 101 forces the wafer 105 into the polishing pad 102 with a predetermined amount of down force. The CMP machine 100 also includes a slurry dispense tube 107, extending across the radius of the polishing pad 102. The slurry dispense tube 107 dispenses a flow of slurry 106 onto the polishing pad 102 from the slurry source 112. The slurry 106 is a mixture of deionized water and polishing agents designed to aid chemically the smooth and predictable planarization of the wafer. In a system using silica slurry the pH of the slurry is very high, typically having a pH of around 10 or 11.

The rotating action of both the polishing pad 102 and the wafer 105, in conjunction with the polishing action of the slurry, combine to planarize, or polish, the wafer 105 at some nominal rate. The polishing action of the slurry is comprised of an abrasive frictional component and a chemical component. The abrasive frictional component is due to the friction between the surface of the polishing pad, the surface of the wafer, and abrasive particles suspended in the slurry. The chemical component is due to the presence in the slurry of polishing agents which chemically interact with the material of the dielectric or metal layer of the wafer. The chemical component of the slurry is used to soften the surface of the dielectric layer to be polished, while the frictional component removes material from the surface of the wafer.

Slurry dispense termination is accomplished by turning off a pump, which will stop the flow of slurry onto the pad. After the slurry dispense process is terminated, deionized water having a pH of about 6 is dispensed from the deionized water source 110 via the water dispense tube 108 onto the pad. The wafer substrate is then rid of the slurry, and the pH at the surface of the wafer is lowered to a pH of about 6.

A typical chemical mechanical polish cycle includes two or more linear or rotary tables that do the planarizing and then a third table that does a water buff on a softer pad. During the chemical mechanical planarization (CMP) process, a wafer undergoes many pH changes. Slurry is used to first polish the wafer and then dionized water is used to clean the wafer afterwards. The pH is raised during the polish steps, then lowered by deionized water whenever the wafer is to be kept wet. At post-CMP cleans, the pH is also raised for cleaning then lowered as the wafer is rinsed and dried. This amounts to many fluctuations between a pH of approximately 11 and a pH of approximately 6.

Figure 3:
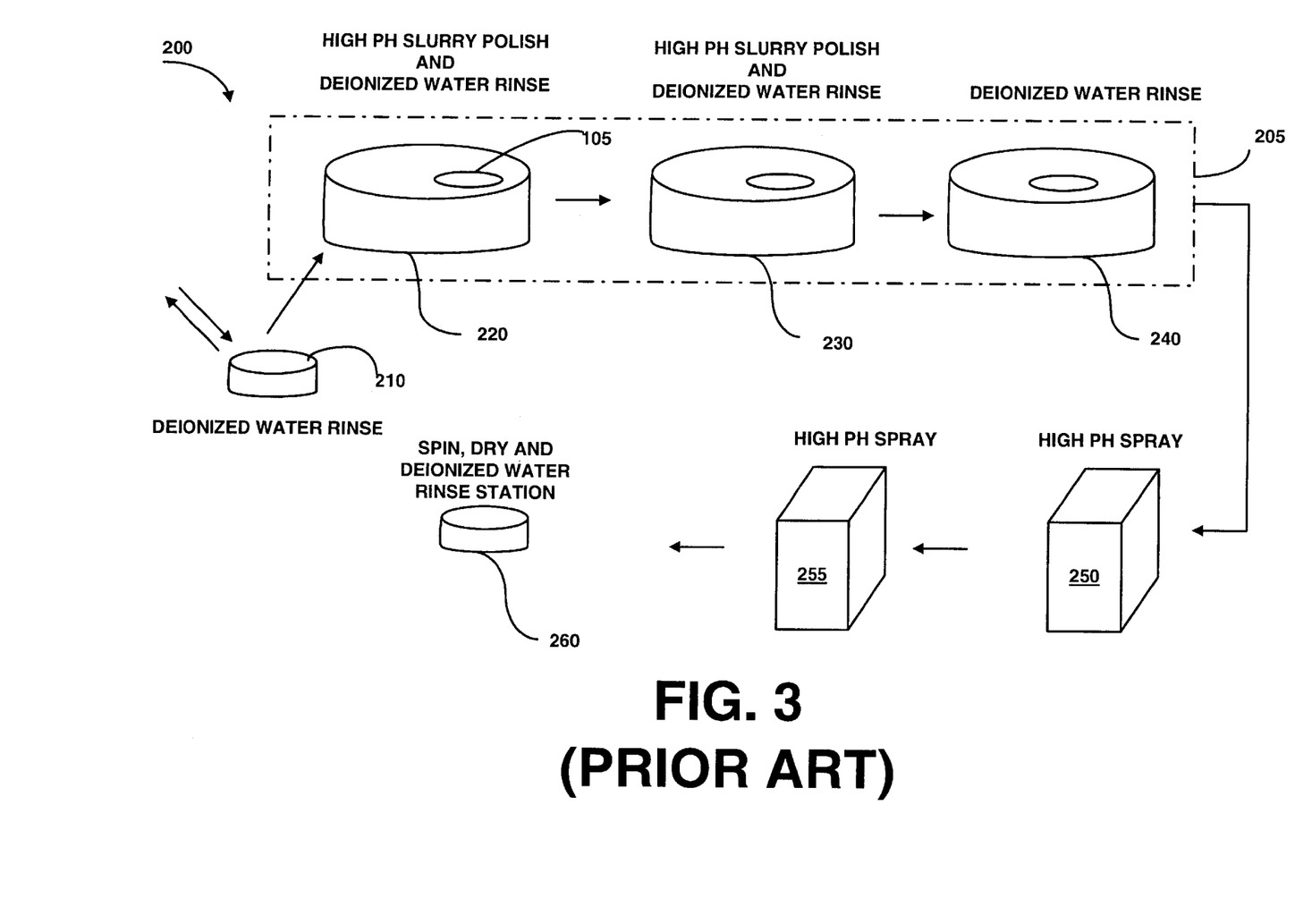
FIG. 3 is a block diagram of one example of a prior art typical CMP process system.

Referring now to FIG. 3, there is shown a block diagram of one example of a prior art typical CMP process 200. To prevent slurry from drying on the wafer, the wafer surface is kept wet through-out the clean-up process. A wet transfer input station mechanism 210 is used to load and unload the wafers while keeping the surface of the wafer wet with deionized water. The wafer 105 is then transferred to polishing platen 220, where a high pH slurry polish is followed by an automatic rinse of deionized water, once the polish is complete. The wafer is then transferred to secondary polishing platen 230, where a second high pH slurry polish is again followed by a deionized water rinse, when the secondary polish is complete. Typically, the wafer is transferred to a third, softer platen 240, where the wafer is buffed on the pad while deionized water is sprayed on the pad. Typically, the above three platens, 220, 230 and 240 are included on the same multiple platen CMP machine 205.

The wafer 105 is then unloaded and kept wet using the input station mechanism 210. Then, optionally, the wafer 105 may be transferred to brush stations 250 and 255, where the wafer is brushed with a scrub solution spray having a pH similar to that of the slurry, such as dilute ammonia, or $NH_4OH$. Finally, the wafer 105 is transferred to the drying station 260, where it is rinsed with deionized water and dryed.

Figure 4:
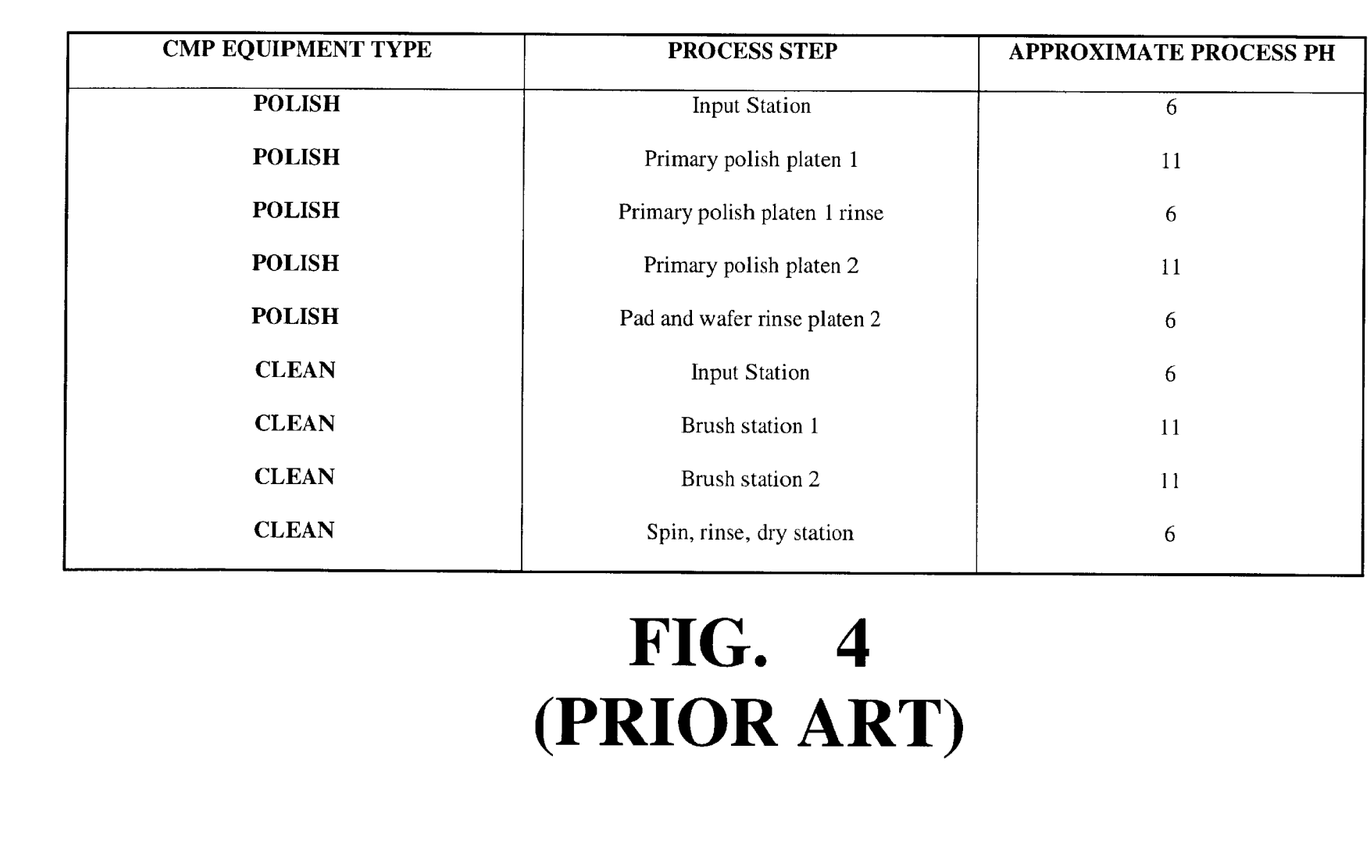
FIG. 4 is a table showing the pH level of the wafer surface at the end of each polishing step of the system of FIG. 3.

FIG. 4 is a table showing the pH level of the wafer surface at the end of each polishing step of the system 200 of FIG. 3. Note that the pH at the surface of the wafer fluctuates numerous times between a pH of approximately 11 and a pH of approximately 6, during the CMP process.

All particulate matter develops an electrically charged thin layer when suspended in a liquid solution. This charge is known as the zeta potential and can be either negative or positive. The zeta potential appears at the outer surface of the particle such that the particle is surrounded by a small charge field. Silica particles in a basic aqueous solution having a pH of about 10 or more results in a negative zeta potential on the silica particles. In addition, the zeta potential of any other particles present, as well as that of the surfaces contacted by the solution, is negative at such a high pH. The silica particles are thus electrostatically repelled from the semiconductor wafer facilitating the removal of the slurry residue from the wafer surface. When the pH at the surface of the wafer is lowered in the presence of silica particles, colloids form and silica agglomeration occurs on the surface of the wafer. As such, any time the pH of the wafer surface is lowered, a higher defectivity environment exists in the presence of microscopic particles. Defects generated include scratches on the wafer by slurry abrasive agglomerates and slurry abrasive (or any other particle) attaching to the wafer surface.

What is needed is a method for providing a constant, high pH through the entire CMP polish and clean process to minimize slurry abrasive agglomeration and fluctuations of pH.

This object, and others, is satisfied by Applicant's present inventions disclosed herebelow.

SUMMARY OF THE INVENTIONS

The present inventions are directed a system and method for chemical mechanical planarization with reduced defects. A high pH is maintained at the wafer surface through the entire polish process and only lowered when necessary in a controlled fashion after CMP and during the post-polish clean. The system includes a wafer input/output area including a wet transfer mechanism for transferring a first wafer to a first polishing platen and to a second polishing platen while keeping the wafer wetted with a high pH solution. A first polishing platen including a first high pH slurry source and a first high pH solution rinse source is used to polish and rinse the wafer surface. A second polishing platen performs a second polish on the wafer using a second high pH slurry source and a second high pH solution rinse source. The number of defects at the surface of the wafer is reduced as the pH at the wafer surface is maintained substantially constant during processing and, preferably, through the post-polish cleans.

Related objects and advantages of the present invention will be apparent from the following description.

BRIEF DESCRIPTION OF THE DRAWINGS

The present invention is illustrated by way of example, and not by way of limitation, in the figures of the accompanying drawings and in which like reference numerals refer to similar elements and in which.

DESCRIPTION OF THE PREFERRED EMBODIMENTS

For the purposes of promoting an understanding of the principles of the inventions, reference will now be made to the embodiments illustrated in the drawings and specific language will be used to describe the same. It will nevertheless be understood that no limitation of the scope of the inventions is thereby intended, such alterations and further modifications of the principles of the inventions as illustrated therein being contemplated as would normally occur to one skilled in the art to which the inventions relate.

A CMP polishing system and method which maintains a constant, high pH through the entire CMP polish and clean process is provided to minimize defectivity by optimizing the wafer surface environment. The present inventions maintain a high pH at the wafer surface through the entire polish process and then lowers the pH only when necessary in a controlled fashion after the post CMP processing. As such, a high pH is maintained until a time when the least number of particles that can cause defects are present in the environment.

Figure 5:
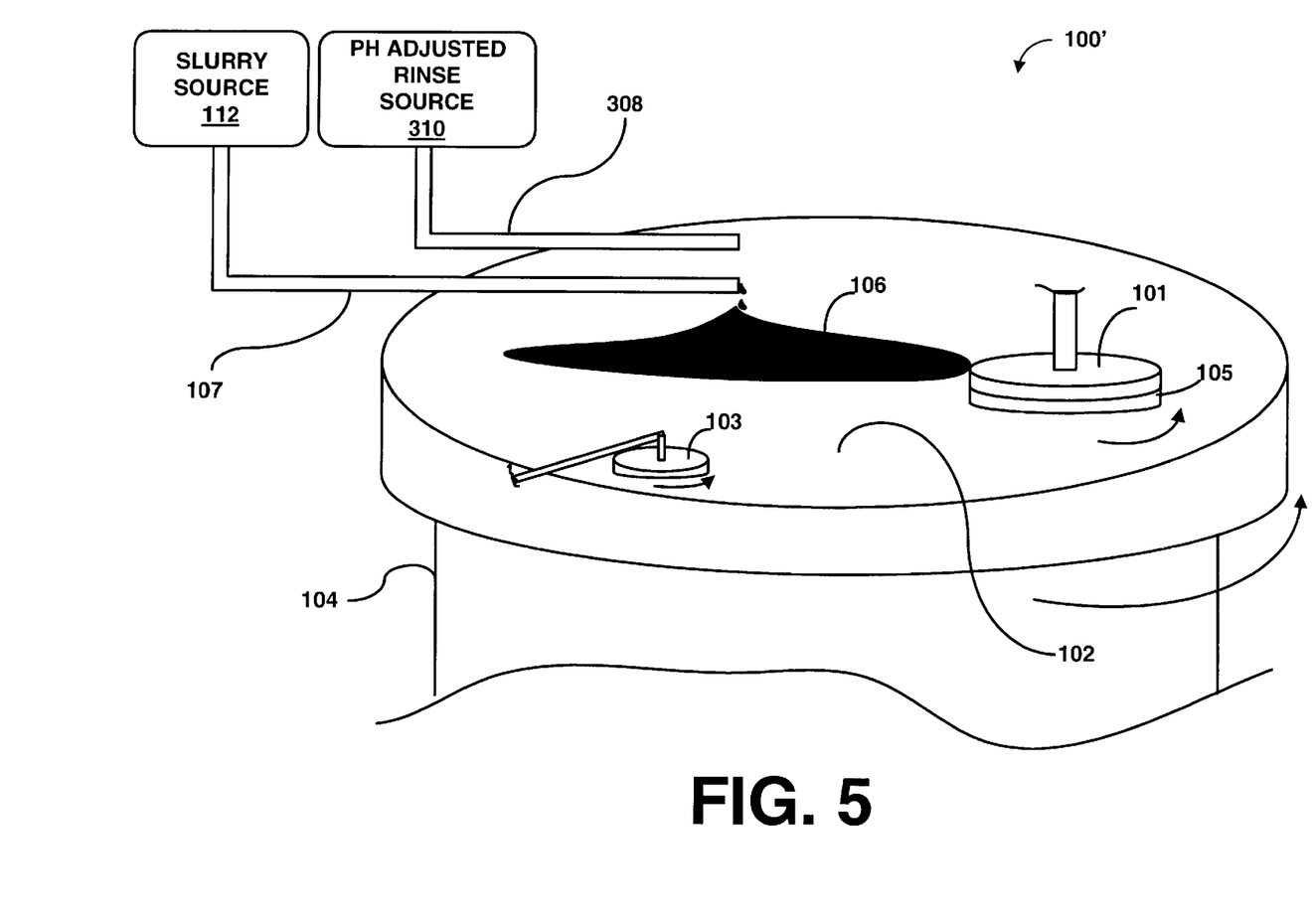
FIG. 5 is a block diagram of a CMP machine in accordance with one embodiment of the present inventions.

Referring now to FIG. 5, there is shown a block diagram of a CMP machine useful with one embodiment of the present inventions. As with the prior art machine of FIG. 1, the CMP machine 100' is fed wafers to be polished by an arm 101 and places them onto a rotating polishing pad 102. The lower surface of the wafer 105 rests against the polishing pad 102.

The CMP machine 100' also includes a slurry dispense tube 107, extending across the radius of the polishing pad 102. The slurry dispense tube 107 dispenses a flow of slurry 106 onto the polishing pad 102 from the slurry source 112. In a system using silica slurry the pH of the slurry is very high, usually around a pH of 10 or 11. Slurry dispense termination is accomplished by turning off a pump, which will stop the flow of slurry onto the pad.

After the slurry dispense process is terminated, the slurry is rinsed from the wafer using a pH adjusted rinse solution from source 310, via rinse tube 308. The pH adjusted rinse has a high pH chemistry and, optionally, surfactants. The pH adjusted rinse replaces the water rinse of the prior art system of FIG. 1. One example of a pH adjusted rinse would be dilute ammonia having a pH of 10 or above. More preferably, the pH adjusted rinse would have a pH of around 11 or above. In one preferred embodiment of the present inventions, the wafer is rinsed with the pH adjusted rinse throughout the entire polish area, including the input/output areas, up until the final spin, rinse and dry station. Thus, the wafer substrate is rid of the slurry, and the pH at the surface of the wafer is maintained at a high pH throughout the process.

Figure 6:
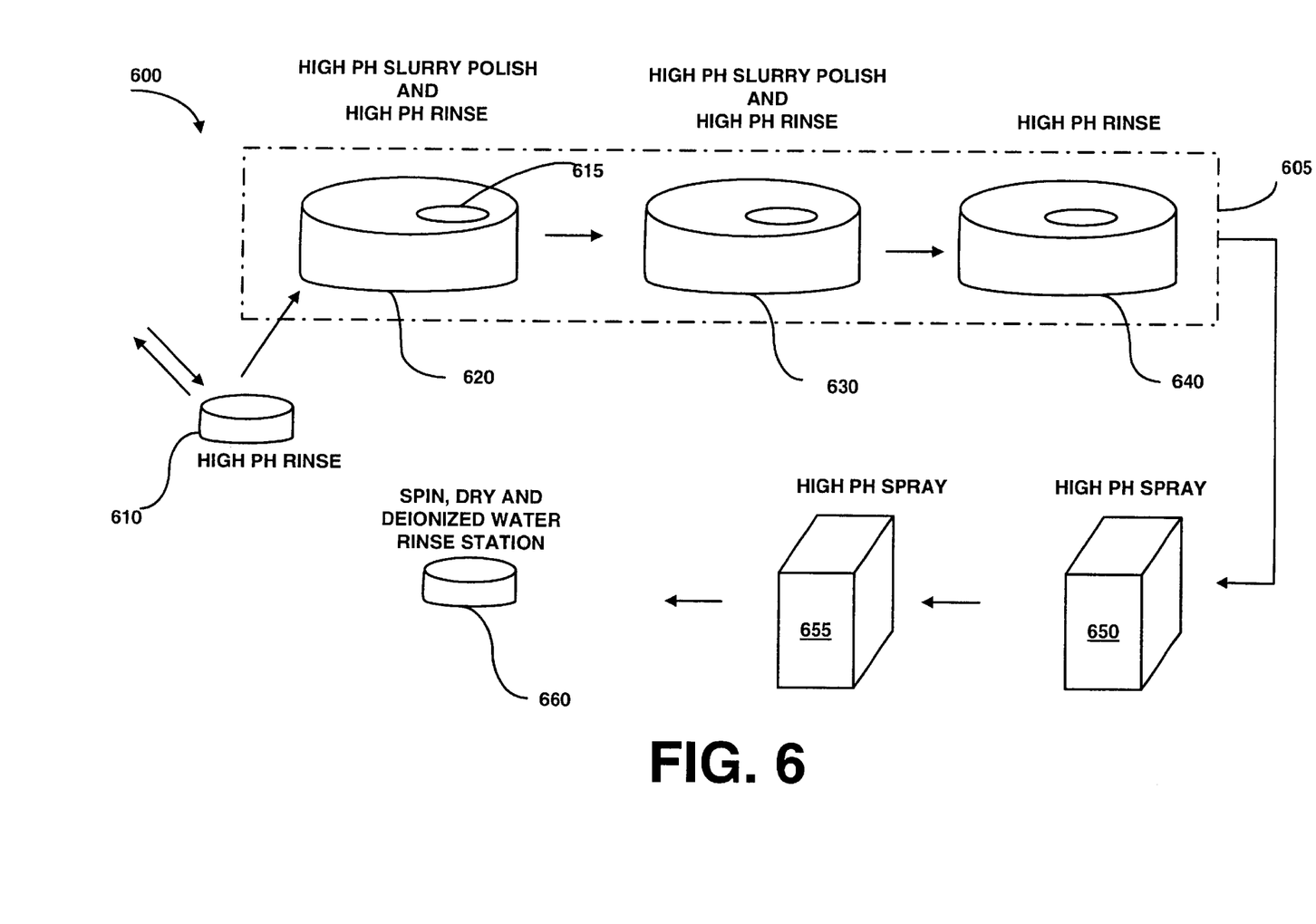
FIG. 6 is a block diagram of a CMP process system in accordance with one embodiment of the present inventions.
Figure 7:
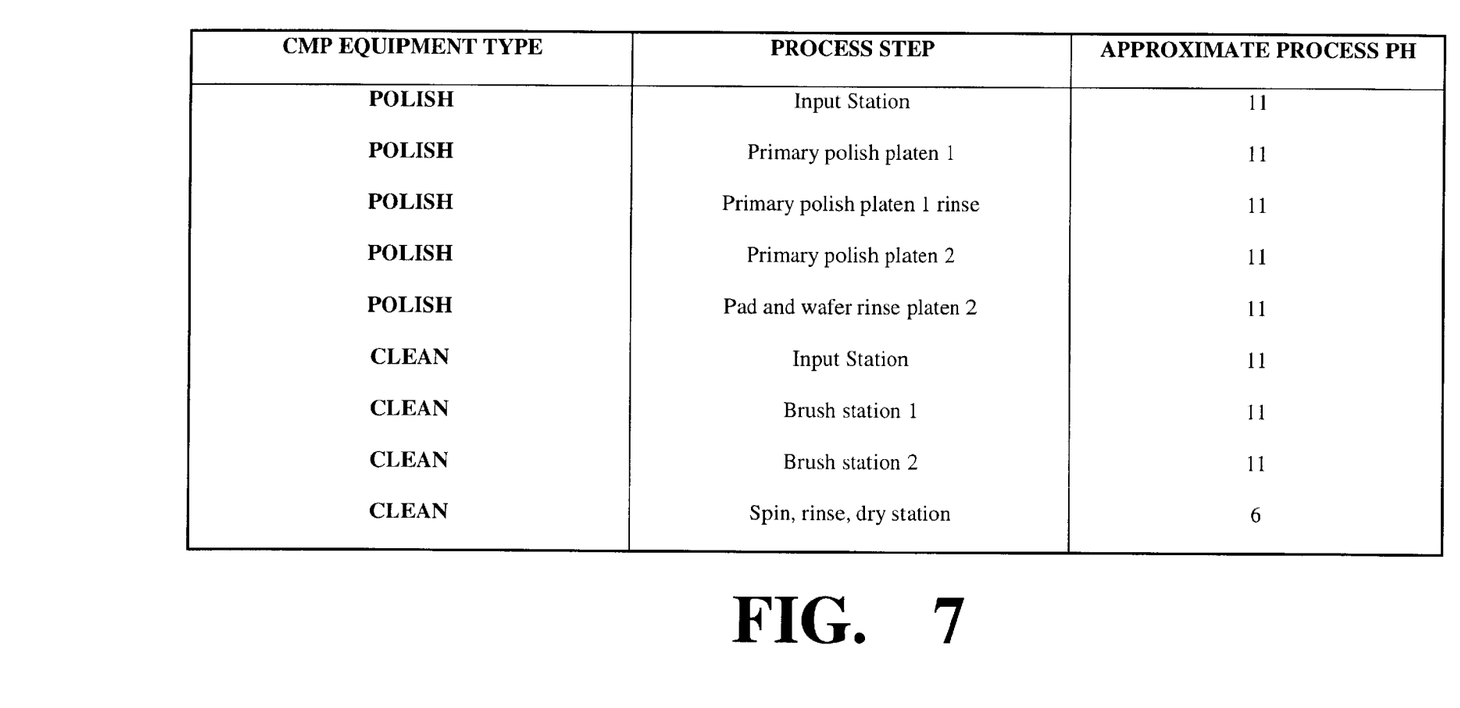
FIG. 7 is a table showing the pH level of the wafer surface at the end of each polishing step of the system of FIG. 6.

Referring now to FIG. 6, there is shown an exemplary chemical mechanical polish cycle 600 using the present inventions. FIG. 7 is a table listing the approximate pH at the surface of the wafer as it passes through the polish cycle 600 of FIG. 6.

The polish cycle of FIG. 6 includes two rotary tables or platens 610 and 620 that do the planarizing of wafer 615, two brush stations 630 and 640 and a third table 650 that does a water buff on a softer pad. A wet transfer input/output loader station 660 is additionally provided. As described in connection with FIG. 5, the present chemical mechanical polish cycle 600 uses a high pH adjusted rinse in place of deionized water during the polish process. Referring to FIG. 6 in connection with the table of FIG. 7, it can be seen that initially, the wafer is wetted at the input station 660 using a solution, such as dilute ammonia, having a pH of approximately 11. In the process of FIG. 6, the wetted wafer is brought into contact with the primary polish platen 610. A silicon based slurry having a pH of between 10 and 12 is used to first polish the wafer. In the present process a pH adjusted rinse solution having a pH that approximates that of the slurry is used to clean the wafer and pad afterwards. As such, while the wafer is still in contact with the pad, the pH adjusted rinse solution cleans the slurry from the wafer and from the pad. The wafer 615 is then transferred to the secondary polishing platen 620, where a high pH slurry polish is again followed by an automatic rinse of a pH adjusted solution, once the polish is complete.

In the present embodiment the wafer 615 is buffed on a softer pad 640 with a high pH solution chosen to approximate the pH of the slurry. The pads 620, 630 and 640 may all be included in a single CMP machine 605, if desired.

After buffing in the present embodiment, the wafer is unloaded and kept wet at the input station mechanism 610 using a high pH rinse solution adjusted to approximate the pH of the slurry and transferred to the brush stations. Alternatively, the wafer may be transported manually after the CMP polish cycle is complete.

The wafer 615 may optionally be transferred to brush stations 650 and 655, where the wafer is brushed with a scrub solution spray having a pH similar to that of the slurry, such as dilute ammonia or $NE_4OH$. At the end of the cycle 600, the wafer is transferred to the drying station 660, where it is rinsed with deionized water and dried. Note from the table of FIG. 7 that the rinse at the drying station 660 is the earliest point in the polish cycle 600 where the wafer is returned to a neutral pH.

Figure 8:
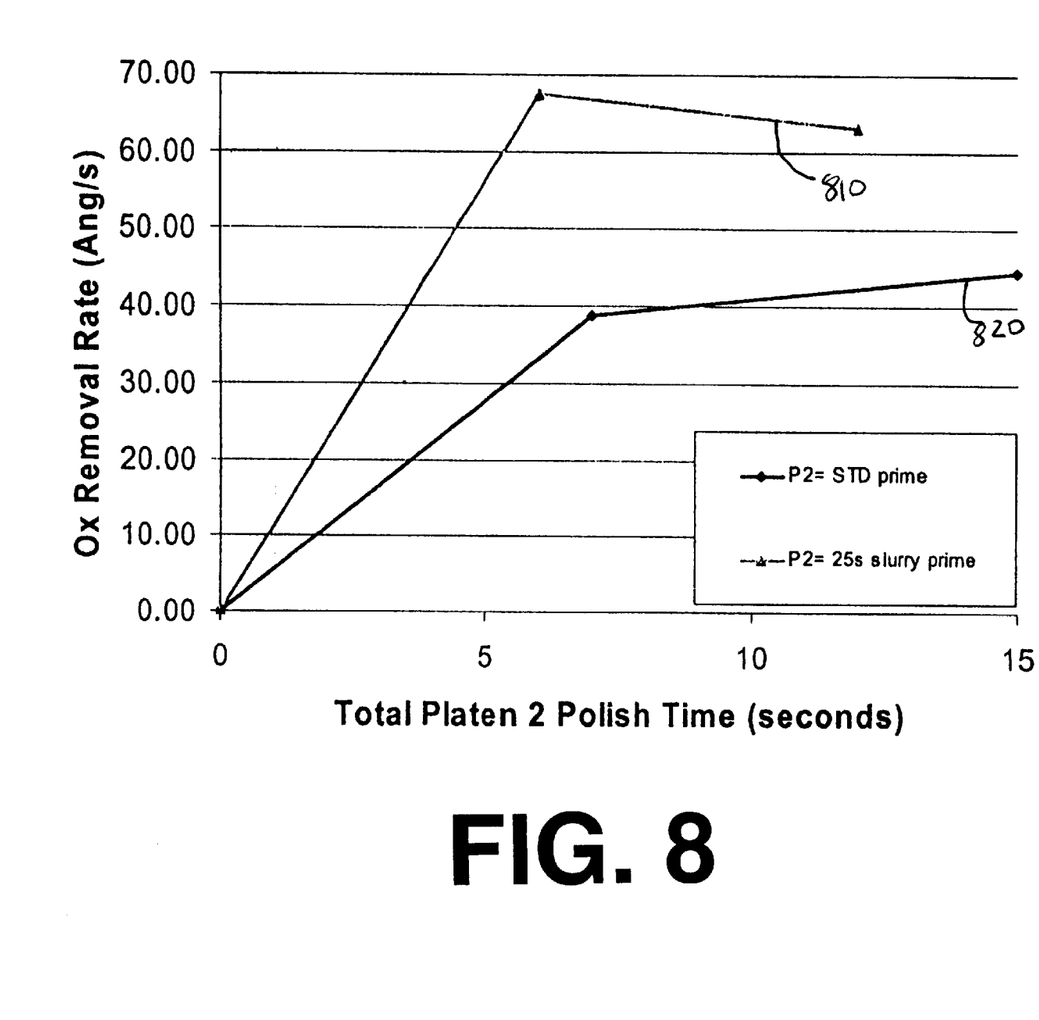
FIG. 8 is a graph of oxide removal rate versus time for a standard slurry prime period and for an extended slurry prime period.
Figure 9:
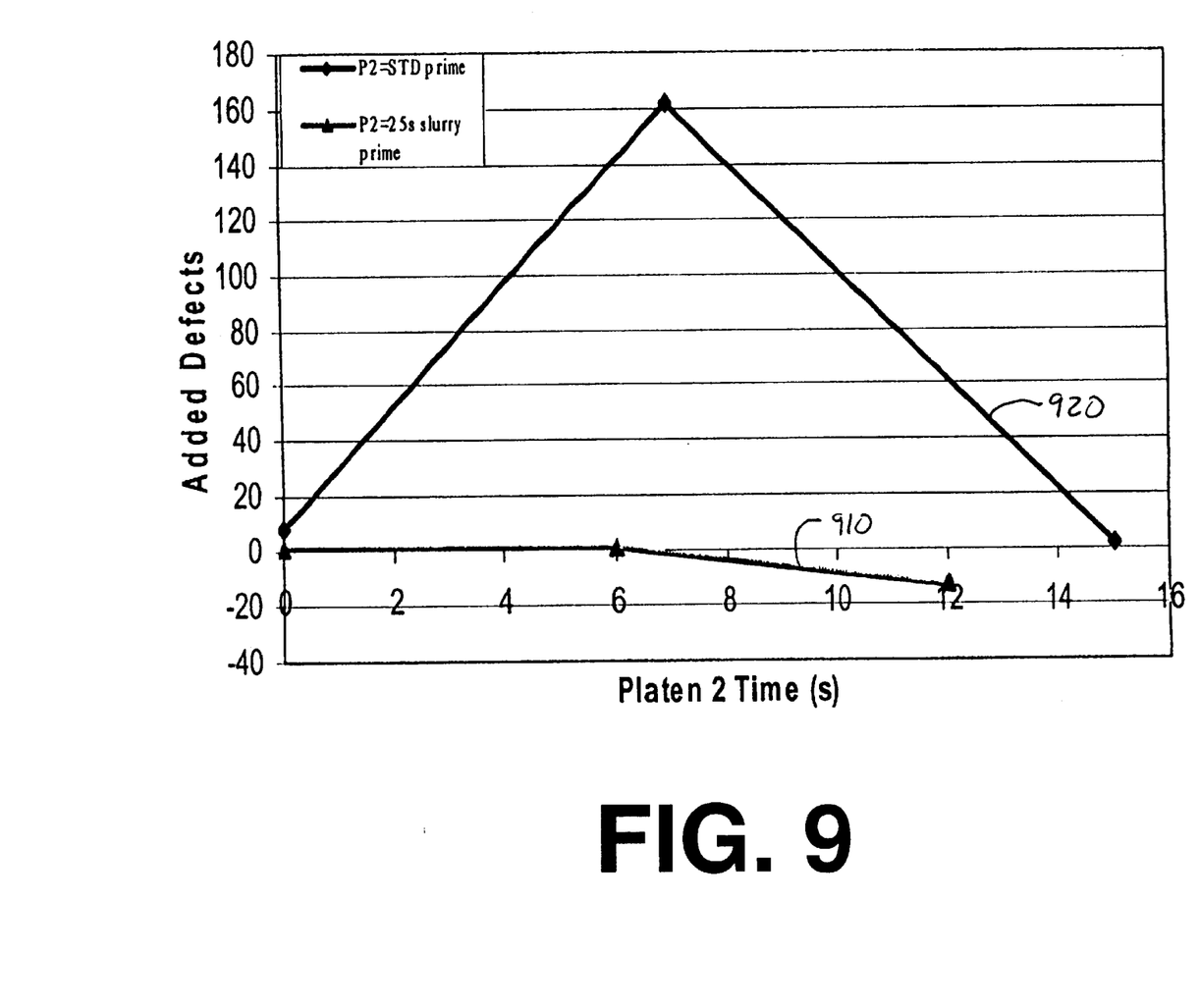
FIG. 9 is a graph of added defects versus time for a standard slurry prime period and for an extended slurry prime period.

Referring now to FIGS. 8 and 9, the decrease in slurry consumption is supported by the empirical data.

FIG. 8 shows a graph of oxide removal rate versus time for a standard slurry prime period 810 and for an extended 25 s slurry prime period 820. Note that the oxide removal rate for the 25 s slurry prime is as high or higher than a wafer polished for a standard polish time. This indicates that the standard slurry prime is effectively raising the pH early in the polish process.

FIG. 9 is a graph of added defects versus time for a standard slurry prime and for an extended 25 s slurry prime. Note that the peak in defect count at six seconds for the standard slurry prime did not occur with the 25 s slurry prime on the same platen.

A wafer processed with large amounts of slurry priming had a high removal rate after 5 seconds. The wafer processed with less slurry priming showed a degraded removal rate even after 15 seconds. The higher number of defects combined with the reduced polish rate indicate that the pH is still rising. If the presence of less abrasive explained the lower rate then defectivity would be lower, not higher.

As such, slurry priming for the process of the present inventions will require only enough volume to provide abrasive to the wafer surface, as the pH is maintained constant throughout the process. Throughput is increased by reducing the amount of post cleaning necessary and decreasing the amount of slurry prime necessary. Costs are additionally decreased through lower defectivity, less slurry usage, and improved asset utilization (via higher throughput).

While the inventions have been illustrated and described in detail in the drawings and foregoing description, the same is to be considered as illustrative and not restrictive in character, it being understood that only the preferred embodiments have been shown and described and that all changes and modifications that come within the spirit of the invention are desired to be protected.

What is claimed:

1. A method of reducing defects on a wafer surface undergoing chemical mechanical planarization, comprising:
   (a) providing a wafer input/output area including a wet transfer mechanism;
   (b) providing a first polishing platen;
   (c) providing a second polishing platen;
   (d) providing a low pH rinsing station;
   (e) transferring a first wafer to said first polishing platen using said wet transfer mechanism, said wet transfer mechanism keeping said first wafer wet with a high pH solution;
   (f) polishing said first wafer on said first platen with a high pH slurry;
   (g) rinsing said first wafer and said first platen with a high pH solution after step (f);
   (h) transferring said first wafer to said second platen after step (g);
   (i) polishing said first wafer on said second platen with a high pH slurry;
   (j) rinsing said first wafer and said second platen with a high pH solution after step (i);
   (k) transferring said first wafer to said low pH rinsing station after step (j);
   (l) rinsing said first wafer with a lower pH solution having a pH lower than said high pH solution at said rinsing station; and
   wherein the pH at the surface of said first wafer is maintained substantially constant during steps (a)–(k).

2. The method of claim 1 wherein, said high pH slurry has a pH of between 10 and 12.

3. The method of claim 2 wherein, said high pH solution has a pH of between 10 and 12.

4. The method of claim 3, wherein said high pH solution has a pH of around 11.

5. The method of claim 3, wherein said high pH solution includes dilute ammonia.

6. The method of claim 1, wherein said lower pH solution has a pH of around 6.

7. The method of claim 6, wherein said lower pH solution is deionized water.

8. The method of claim 7, wherein said low pH rinsing station is located at a drying station.

9. The method of claim 1, additionally including:
   providing at least one brush scrubber; and
   scrubbing said first wafer with said at least one brush scrubber after step (j) and prior to rinsing said first wafer with said lower pH solution.

10. The method of claim 9 additionally including, spraying said first wafer with a high pH solution while scrubbing said first wafer.

* * * * *